US012650347B2

(12) United States Patent
Hsieh et al.

(10) Patent No.: US 12,650,347 B2
(45) Date of Patent: Jun. 9, 2026

(54) INTEGRATION FRIENDLY THERMAL SENSOR

(71) Applicant: MEDIATEK INC., Hsin-Chu (TW)

(72) Inventors: Min-Hang Hsieh, Hsinchu City (TW);
Jyun-Jia Huang, Hsinchu City (TW);
Chien-Sheng Chao, Hsinchu City
(TW); Ghien-An Shih, Hsinchu City
(TW); Ching-Chung Ko, Hsinchu City
(TW); Yu-Cheng Su, Hsinchu City
(TW); Lin-Chien Chen, Hsinchu City
(TW); Ai-Yun Liu, Hsinchu City (TW);
Chia-Hsin Hu, Hsinchu City (TW)

(73) Assignee: MEDIATEK INC., Hsinchu City (TW)

( * ) Notice: Subject to any disclaimer, the term of this
patent is extended or adjusted under 35
U.S.C. 154(b) by 626 days.

(21) Appl. No.: 17/719,387

(22) Filed: Apr. 13, 2022

(65) Prior Publication Data

US 2022/0357211 A1 Nov. 10, 2022

Related U.S. Application Data

(60) Provisional application No. 63/184,329, filed on May
5, 2021.

(51) Int. Cl.
*G01K 7/01* (2006.01)
*H10D 99/00* (2025.01)

(52) U.S. Cl.
CPC .............. *G01K 7/01* (2013.01); *H10D 99/00*
(2025.01)

(58) Field of Classification Search
None
See application file for complete search history.

(56) References Cited

U.S. PATENT DOCUMENTS

| | | | |
|---|---|---|---|
| 6,144,085 A | 11/2000 | Barker | |
| 7,661,878 B1 * | 2/2010 | Lall ......................... | G01K 7/01 |
| | | | 374/170 |
| 7,701,038 B2 | 4/2010 | Chen et al. | |
| 8,035,165 B2 | 10/2011 | Yeh et al. | |
| 8,115,280 B2 | 2/2012 | Chen et al. | |
| 8,373,229 B2 | 2/2013 | Chen et al. | |
| 8,405,943 B2 | 3/2013 | Song et al. | |
| 8,415,764 B2 | 4/2013 | Chung et al. | |
| 8,455,952 B2 | 6/2013 | Lin et al. | |
| 8,525,278 B2 | 9/2013 | Chu et al. | |
| 8,530,326 B2 | 9/2013 | Lai et al. | |
| 8,574,995 B2 | 11/2013 | Jeng | |
| 8,586,436 B2 | 11/2013 | Ng et al. | |
| 8,610,241 B1 | 12/2013 | Hu et al. | |
| 8,703,571 B2 | 4/2014 | Ke et al. | |
| 8,881,066 B2 | 11/2014 | Shieh et al. | |
| 8,889,460 B2 | 11/2014 | Hsu et al. | |
| 8,901,665 B2 | 12/2014 | Kelly et al. | |

(Continued)

FOREIGN PATENT DOCUMENTS

| | | |
|---|---|---|
| JP | 2002-296121 A | 10/2002 |
| TW | 202119002 A | 5/2021 |
| TW | 202206973 A | 2/2022 |

*Primary Examiner* — Cassandra F Cox
(74) *Attorney, Agent, or Firm* — Winston Hsu

(57) ABSTRACT

The present invention provides a processing circuit includ-
ing logic cells and a thermal sensor. The thermal sensor is
positioned within the logic cells and surrounded by the logic
cells, and the logic cells and the thermal sensor are all
implemented by core devices.

12 Claims, 2 Drawing Sheets

(56) References Cited

U.S. PATENT DOCUMENTS

| | | | |
|---|---|---|---|
| 8,921,218 | B2 | 12/2014 | Yang et al. |
| 9,076,889 | B2 | 7/2015 | Lee et al. |
| 9,093,566 | B2 | 7/2015 | Fan et al. |
| 9,146,469 | B2 | 9/2015 | Liu et al. |
| 9,177,801 | B2 | 11/2015 | Lee et al. |
| 9,184,265 | B2 | 11/2015 | Lai et al. |
| 9,202,691 | B2 | 12/2015 | Huang et al. |
| 9,209,156 | B2 | 12/2015 | Len et al. |
| 9,263,342 | B2 | 2/2016 | Lee et al. |
| 9,337,190 | B2 | 5/2016 | Fung |
| 9,397,157 | B2 | 7/2016 | Kuo et al. |
| 9,461,170 | B2 | 10/2016 | Lin et al. |
| 9,536,964 | B2 | 1/2017 | Shiao et al. |
| 9,595,475 | B2 | 3/2017 | Liaw |
| 9,780,003 | B2 | 10/2017 | Hu et al. |
| 9,793,385 | B2 | 10/2017 | Huo et al. |
| 9,912,228 | B2 | 3/2018 | Al-Shyoukh et al. |
| 10,008,531 | B2 | 6/2018 | Chou et al. |
| 10,049,885 | B2 | 8/2018 | Ng et al. |
| 10,170,332 | B2 | 1/2019 | Huang |
| 10,296,032 | B2 | 5/2019 | Horng et al. |
| 10,361,220 | B2 | 7/2019 | Wang et al. |
| 11,569,220 | B2 * | 1/2023 | Wang .................. H10D 89/611 |
| 2009/0285261 | A1 | 11/2009 | Casey |
| 2013/0228830 | A1 | 9/2013 | Lee et al. |
| 2013/0237026 | A1 | 9/2013 | Lee et al. |
| 2013/0320451 | A1 | 12/2013 | Liu et al. |
| 2016/0124300 | A1 | 5/2016 | Ho et al. |
| 2020/0105901 | A1 | 4/2020 | Cheng et al. |
| 2020/0357787 | A1 | 11/2020 | Sheu et al. |
| 2021/0050341 | A1 | 2/2021 | Wang |

* cited by examiner

INTEGRATION FRIENDLY THERMAL SENSOR

CROSS REFERENCE TO RELATED APPLICATIONS

This application claims the benefit of U.S. Provisional Application No. 63/184,329, filed on May 5, 2021. The content of the application is incorporated herein by reference.

BACKGROUND

Recently, a plurality of processing circuits and modules are integrated into a chip to save the manufacturing cost. Because each of the processing circuits and the modules can be regarded as a heat source, many thermal sensors are positioned within the chip to measure temperatures of some critical points, for the control mechanism of the processing circuits and modules. However, because the thermal sensor has input/output (I/O) device having higher voltage endurance, and the I/O device cannot be manufactured in an area adjacent to core devices that are used implement the logical cells within the chip, so that the temperature measured by the thermal sensor cannot truly reflect the real temperature. In addition, because the hottest region of the chip is also the most timing critical region, the thermal sensor with large chip area is not suitable to be placed near the hottest region because the thermal sensor may impact system performance.

SUMMARY

It is therefore an objective of the present invention to provide a chip comprising a thermal sensor, wherein the thermal sensor has a small area and can accurately measure the temperature of a hottest region of the chip, to solve the above-mentioned problems.

According to one embodiment of the present invention, a processing circuit comprising logic cells and a thermal sensor is disclosed. The thermal sensor is positioned within the logic cells and surrounded by the logic cells, and the logic cells and the thermal sensor are all implemented by core devices.

According to one embodiment of the present invention, a chip comprising at least one processing circuit is disclosed. The chip comprises logic cells and a thermal sensor, wherein the thermal sensor is positioned within the logic cells and surrounded by the logic cells, and the logic cells and the thermal sensor are all implemented by core devices.

According to one embodiment of the present invention, a processing circuit comprising logic cells and a thermal sensor is disclosed, wherein the thermal sensor is immediately adjacent to the surrounding logic cells, and there is no dummy region between the thermal sensor and the surrounding logic cells.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
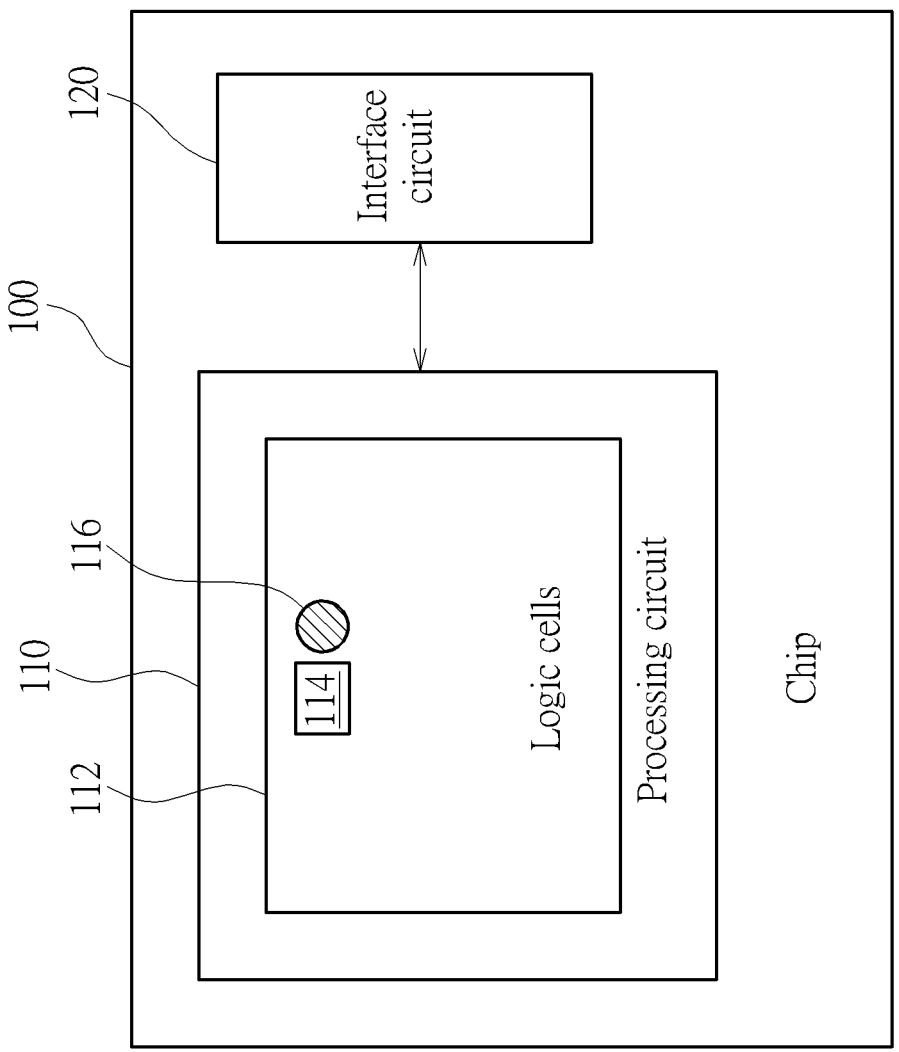
FIG. 1 is a diagram illustrating a chip according to one embodiment of the present invention.

FIG. 1 is a diagram illustrating a chip 100 according to one embodiment of the present invention. As shown in FIG. 1, the chip 100 comprises at least one processing circuit such as a central processing unit (CPU) or a graphics processing unit (GPU), wherein the chip 100 comprises the processing circuit 110 and an interface circuit 120 in this embodiment. The processing circuit 110 comprises logic cells 112 and at least one thermal sensor 114, and the processing circuit 110 can communicate with the external components via the interface circuit 120, wherein each of the logic cells 112 is a basic building block that consists of one or more components or a register, and can be configured individually for either sequential or combinational logic operation.

In this embodiment, the thermal sensor 114 and the logic cells 112 are all implemented by using core devices, and the thermal sensor 114 is surrounded by the logic cells 112. About the comparison between the I/O device and the core device, the I/O device has a higher operating voltage, that is, can be operated by a higher supply voltage; and on the other hand, the core device has a lower operating voltage, that is, can be operated by a lower supply voltage. In addition, the I/O device has higher voltage endurance (i.e. high-voltage device), and the core device has lower voltage endurance (i.e. low-voltage device). It is noted that a person skilled in this art will readily understand that the distinction between the core device and the I/O device can be defined by the threshold voltage (Vth) of the transistor, the gate oxide thickness of the transistor, the junction breakdown voltage of the transistor, the well doping density of the transistor, the static leakage current of the transistor, or other suitable characteristics known in the semiconductor field. Therefore, since the thermal sensor 114 and the logic cells 112 are all implemented by core devices, the thermal sensor 114 and the logic cells 112 can be supplied by the same operating voltage, and/or the thermal sensor 114 and the logic cells 112 can be low-voltage devices, and/or the thermal sensor 114 and the logic cells 112 have the same or similar voltage endurance, and/or the thermal sensor 114 and the logic cells 112 have the same oxide thickness of the transistor.

In addition, regarding the interface circuit 120, because the interface circuit 120 is used to connect to the external components, at least a portion of the interface circuit 120 may be implemented by using the I/O devices for higher voltage endurance.

Because the thermal sensor 114 is implemented by using the core device, the thermal sensor 114 can be placed near to a hotspot (hottest region) 116 of the processing circuit 110 without impacting system performance too much. In addition, because the thermal sensor 114 and the logic cells 112 are core devices, the same rule can be used for the design of the thermal sensor 114 and the logic cells 112, that is the thermal sensor 114 can be placed immediately adjacent to the surrounding logic units, and there is no dummy cell or dummy region placed between the thermal sensor 114 and the logic cells 112. Therefore, the area of the thermal sensor 114 can be greatly reduced.

Figure 2:
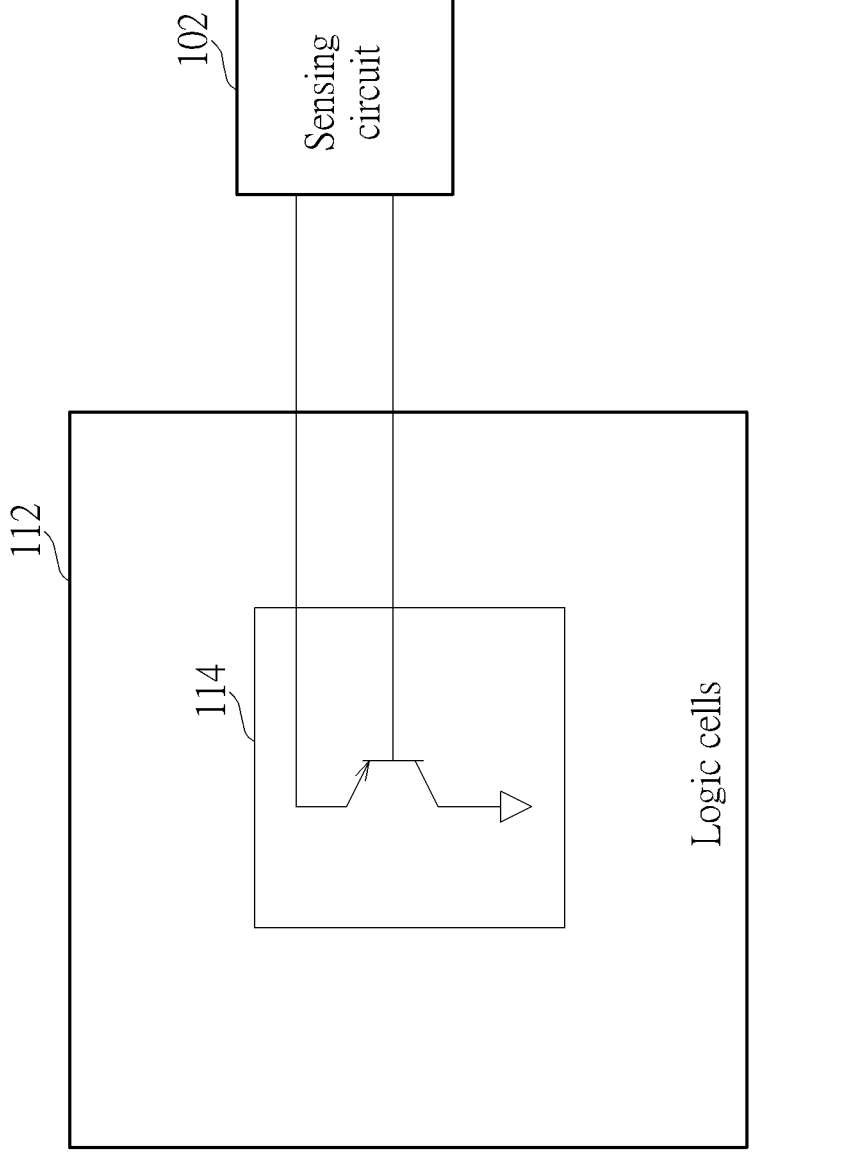
FIG. 2 is a diagram of using BJT to implement the thermal sensor.

In one embodiment, the thermal sensor 114 is a bipolar junction transistor (BJT) thermal sensor. Referring to FIG. 2, an emitter and a based electrode of the thermal sensor 114 is coupled to a sensing circuit 102 for measuring the temperature within the logic cells. In this embodiment, the logical cells 112 are implemented by many metal-oxide-semiconductor field-effect transistors (MOSFETs), and the logical cells 112 implemented by using MOSFETs and the thermal sensor 114 implemented by using BJT are manufactured as core devices, that is the logical cells 112 and the thermal sensor 114 have the same or similar characteristics such as similar voltage endurance.

In the conventional art, if the thermal sensor is implemented by using the I/O device, a dummy region must be placed between the I/O device and the core devices, wherein the dummy region may be blank region that is intentionally designed, or the dummy region may comprise dummy cells that are irrelevant to normal operations of the logic cells (i.e., the processing circuit can work normally if the dummy cells are removed). In the embodiment of the present invention, because the logic cells 112 and the thermal sensor 114 are under the core device design rule, there is no dummy region between the logic cells 112 and the thermal sensor 114. That is, there is no blank region intentionally designed around the thermal sensor 114, and no dummy cell is intentionally designed around the thermal sensor 114. In other words, the logic cells 112 surrounding the thermal sensor 114 have the required functions for the processing circuit 110, and are not dummy cells.

Briefly summarized, in the embodiments of the present invention, by using the core devices to design the thermal sensor and the logic cells, the thermal sensor can be positioned near to the hotspot of the logic cells to measure the temperature more accurately without affecting the system performance too much. In addition, because the thermal sensor and the logic cells are all core devices, the thermal sensor can be immediately adjacent to the logic cells, and the chip area of the thermal sensor can be greatly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A processing circuit, comprising:
   logic cells; and
   a thermal sensor, positioned within the logic cells and surrounded by the logic cells;
   wherein the processing circuit and an another circuit is within a chip, and at least a portion of the another circuit is implemented by input/outout (I/O) devices;
   wherein the logic cells and the thermal sensor are all implemented by core devices, and voltage endurance of the I/O devices is higher than that of the core devices.

2. The processing circuit of claim 1, wherein the thermal sensor is a bipolar junction transistor (BJT) thermal sensor.

3. The processing circuit of claim 1, wherein the thermal sensor is immediately adjacent to the surrounding logic cells, and there is no dummy region between the thermal sensor and the surrounding logic cells.

4. The processing circuit of claim 3, wherein there is no blank region and no dummy cell between the thermal sensor and the surrounding logic cells.

5. The processing circuit of claim 3, wherein the logic cells surrounding the thermal sensor have functions for a normal operation of the processing circuit.

6. The processing circuit of claim 1, wherein the another circuit is an interface circuit within the chip.

7. A chip comprising:
   at least one processing circuit; and
   another circuit, wherein at least a portion of the another circuit is implemented by input/output (I/O) devices;
   wherein the at least one processing circuit comprises:
      logic cells; and
      a thermal sensor, positioned within the logic cells and surrounded by the logic cells;
      wherein the logic cells and the thermal sensor are all implemented by core devices, and voltage endurance of the I/O devices is higher than that of the core devices.

8. The chip of claim 7, wherein the thermal sensor is a bipolar junction transistor (BJT) thermal sensor.

9. The chip of claim 7, wherein the thermal sensor is immediately adjacent to the surrounding logic cells, and there is no dummy region between the thermal sensor and the surrounding logic cells.

10. The chip of claim 9, wherein there is no blank region and no dummy cell between the thermal sensor and the surrounding logic cells.

11. The chip of claim 9, wherein the logic cells surrounding the thermal sensor have functions for a normal operation of the processing circuit.

12. The chip of claim 7, wherein the another circuit is an interface circuit within the chip.

* * * * *